(12) United States Patent
Tseng et al.

(10) Patent No.: US 7,366,274 B2
(45) Date of Patent: Apr. 29, 2008

(54) BIDIRECTIONAL SHIFT REGISTER

(75) Inventors: Ming-Chun Tseng, Tainan County (TW); Hong-Ru Guo, Tainan County (TW); Chien-Hsiang Hunag, Tainan County (TW)

(73) Assignees: Chi Mei El Corporation, Tainan Science-Based Industrial Park, Tainan County (TW); Chi Mei Optoelectronics Corporation, Tainan Science-Based Industrial Park, Tainan County (TW)

( * ) Notice: Subject to any disclaimer, the term of this patent is extended or adjusted under 35 U.S.C. 154(b) by 169 days.

(21) Appl. No.: 11/426,010

(22) Filed: Jun. 22, 2006

(65) Prior Publication Data
US 2007/0047691 A1    Mar. 1, 2007

(30) Foreign Application Priority Data
Aug. 30, 2005    (TW) .............................. 94129677 A
May 2, 2006    (TW) .............................. 95115619 A

(51) Int. Cl.
*G11C 19/00*    (2006.01)

(52) U.S. Cl. .......................................... 377/64; 377/69

(58) Field of Classification Search .................. 377/64, 377/69, 77, 78
See application file for complete search history.

(56) References Cited

U.S. PATENT DOCUMENTS

| 5,282,234 A * | 1/1994 | Murayama et al. | 377/69 |
| 5,894,296 A * | 4/1999 | Maekawa | 345/98 |
| 2004/0052327 A1* | 3/2004 | Yu | 377/64 |
| 2005/0084059 A1* | 4/2005 | Yu | 377/34 |

FOREIGN PATENT DOCUMENTS

JP    2004288697    * 10/2004

* cited by examiner

*Primary Examiner*—Tuan T Lam
(74) *Attorney, Agent, or Firm*—Winston Hsu

(57) ABSTRACT

A bidirectional shift register includes a former stage multiplexer, a latter stage multiplexer, a former stage full-swing shift register, and a latter stage full-swing shift register, all of which have a plurality of registers all of the same type. The former and the latter stage multiplexers output signals according to a forward clock, a backward clock, a forward control signal, and a backward control signal. The former and the latter stage full-swing shift register store the signals output from the former and the latter stage full-swing shift registers respectively.

15 Claims, 12 Drawing Sheets

BIDIRECTIONAL SHIFT REGISTER

BACKGROUND OF THE INVENTION

1. Field of the Invention

The present invention relates to a bidirectional shift register, and more specifically, to a bidirectional shift register having transistors of a same type.

2. Description of the Prior Art

Please refer to FIG. 1, which is a circuit diagram of a complementary metal oxide semiconductor (CMOS) bidirectional shift register 10 made by applying low temperature poly silicon (LTPS) technology on a glass substrate according to the prior art.

The bidirectional shift register 10 comprises a former stage SR latch circuit 12, a former stage bidirectional control circuit 14 corresponding to the former stage SR latch circuit 12, a latter stage SR latch circuit 16, and a latter stage bidirectional control circuit 18 corresponding to the latter stage SR latch circuit 16. The former stage control circuit 14 is coupled between the former stage SR latch circuit 12 and the latter stage SR latch circuit 16. The latter stage bidirectional control circuit 18 is coupled between the latter stage SR latch circuit 16 and the other SR latch circuit located in the next segment after the latter stage SR latch circuit 16. The former stage SR latch circuit 12 and the latter stage SR latch circuit 16 are both electrically connected to a forward clock CK and a backward clock XCK. The former stage bidirectional control circuit 14 comprises a forward CMOS 20 and a backward CMOS 22, and the latter stage bidirectional control circuit 18 comprises a forward CMOS 24 and a backward CMOS 26, too. A gate of an N-type MOS in the forward CMOS 20, 24 and a gate of a P-type MOS in the backward CMOS 22, 26 are for receiving a forward control signal FW_control. A gate of a P-type MOS in the forward CMOS 20, 24 and a gate of an N-type MOS in the backward CMOS 22, 26 are for receiving a backward control signal BW_control.

The operation of the bidirectional shift register 10 is as follows. When the forward control signal FW_control has a logic high voltage and the backward control signal BW_control relative to the forward control signal FW_control has a logic low voltage, both the forward CMOS 20 of the former stage bidirectional control circuit 14 and the forward CMOS 24 of the latter stage bidirectional control circuit 18 are electrically on, and both the backward CMOS 22 of the former stage bidirectional control circuit 14 and the backward CMOS 26 of the latter stage bidirectional control circuit 18 are off.

FIG. 2 shows the circuit diagram of the CMOS bidirectional shift register 10 without displaying the off circuits as in FIG. 1 described above. The signal received in a forward input end INPUT_FW of the bidirectional shift register 10 goes to an input end IN of the former stage SR latch circuit 14, to an output end OUT of the former SR latch circuit 12, to the former CMOS 20 of the forward bidirectional control circuit 14, to an input end IN of the latter stage SR latch circuit 16, to an output end OUT of the latter stage SR latch circuit 16, to the forward CMOS 24 of the latter stage bidirectional control circuit 18, and to a forward output end OUTPUT_FW of the bidirectional shift register 10 in order.

On the other hand, when the forward control signal FW_control has a logical low voltage and the backward control signal BW_control has a logical high voltage, both the forward CMOS 20 of the former stage bidirectional control circuit 14 and the forward CMOS 24 of the backward bidirectional control circuit 18 are off, while both the backward CMOS 22 of the former stage bidirectional control circuit 14 and the backward CMOS 26 of the latter stage bidirectional control circuit 18 are on. This is shown in FIG. 3 without displaying the off circuits for clarity. In this case, the signal received in a backward input end INPUT_BW of the bidirectional shift register 10 goes to the backward CMOS 26 of the latter stage control circuit 18, to the input end IN of the latter stage SR latch circuit 16, to the output end OUT of the latter stage latch circuit 16, to the backward CMOS 22 of the former stage bidirectional control circuit 14, to the input end IN of the former stage SR latch circuit 12, to the output end OUT of the former stage SR latch circuit 12, and to a backward output end OUTPUT_BW of the bidirectional shift register 10 in order.

However, since the bidirectional shift register 10 includes CMOS elements, such as the forward CMOS 20 and the backward CMOS 26, two sets of different photo masks are needed when manufacturing the bidirectional shift register 10, therefore increasing the manufacturing cost.

SUMMARY OF THE INVENTION

Therefore, the primary objective of the present invention is to provide a bidirectional shift register to solve the above problem.

The claimed invention provides a bidirectional shift register having transistors of a same type. The bidirectional shift register comprises a former stage multiplexer, a former stage full-swing shift register, a latter stage multiplexer, and a latter stage full-swing shift register. The former stage multiplexer comprises a first transistor having a source for receiving a signal and a gate for receiving a forward clock; a second transistor having a source coupled with a drain of the first transistor, a gate for receiving a forward control signal, the second transistor being of a same type as the first transistor; a third transistor having a drain coupled with a drain of the second transistor, a gate for receiving a backward control signal, the third transistor being of the same type as the first transistor; and a fourth transistor having a drain coupled with a source of the third transistor, a gate for receiving the forward clock, the fourth transistor being of the same type as the first transistor. The former stage full-swing shift register comprises a fifth transistor having a gate coupled with the drain of the second transistor, a source for receiving a backward clock, the fifth transistor being of the same type as the first transistor; a sixth transistor having a source coupled with a drain of the fifth transistor, a gate coupled with the gate of the first transistor, a drain for coupling with a first power source, the sixth transistor being of the same type as the first transistor; and a former stage capacitor having a first end coupled with the gate of the fifth transistor and a second end grounded. The latter stage multiplexer comprises a seventh transistor having a source for receiving a signal and a gate for receiving the backward clock, the seventh transistor being of the same type as the first transistor; an eighth transistor having a source coupled with a drain of the seventh transistor, a gate for receiving the backward control signal, the eighth transistor being of the same type as the first transistor; a ninth transistor having a drain coupled with a drain of the eighth transistor, a gate for receiving the forward control signal, the ninth transistor being of the same type as the first transistor; and a tenth transistor having a drain coupled with a source of the ninth transistor, a gate for receiving the backward clock, a source coupled with the drain of the fifth transistor of the former stage full-swing shift register, the tenth transistor being of the same type as the first transistor. The latter stage full-swing shift register comprises an eleventh transistor having a gate coupled with the drain of the eighth transistor, a source for receiving the forward clock, a drain coupled with the source of the fourth transistor of the former stage multiplexer, the eleventh transistor being of the same type as the first transistor; a twelfth transistor having a source coupled with the drain of the eleventh transistor, a gate coupled with the gate of the seventh transistor, a drain for coupling with the first power source, the twelfth transistor being of the same type as the first transistor; and a latter stage capacitor having a first end coupled with the gate of the eleventh transistor and a second end grounded.

The claimed invention further provides a bidirectional shift register having transistors of a same type. The bidirectional shift register comprises a former stage multiplexer, a former stage full-swing shift register, a latter stage multiplexer, and a latter stage full-swing shift register. The former stage multiplexer comprises a first switch having a first end for receiving a forward clock, the first switch being controlled by a forward control signal for sending the forward clock received at the first end to a second end of the first switch; a second switch having a first end for receiving a disabling signal, a second end coupled with the second end of the first switch, the second switch being controlled by a backward control signal for sending the disabling signal received at the first end to the second end of the second switch, the second switch comprising transistors of a same type as the transistors of the first switch; a third switch having a first end for receiving signals, the third switch being controlled by the forward clock sent by the first switch when the first switch is turned on and the disabling signal sent by the second switch when the second switch is turned on, for sending signals received at the first end to a second end of the third switch, the third switch comprising transistors of the same type as the transistors of the first switch; a fourth switch having a first end for receiving the forward clock, the fourth switch being controlled by a backward control signal for sending the forward clock received at the first end to a second end of the fourth switch, the fourth switch comprising transistors of the same type as the transistors of the first switch; a fifth switch having a first end for receiving the disabling signal, a second end coupled with the second end of the fourth switch, the fifth switch being controlled by the forward control signal for sending the disabling signal received at the first end to the second end of the fifth switch, the fifth switch comprising transistors of the same type as the transistors of the first switch; and a sixth switch having a first end for coupling with the output end of the latter stage full-swing shift register, a second end coupled with the second end of the third switch, the sixth switch being controlled by the forward clock sent by the fourth switch when the fourth switch is turned on and the disabling signal sent by the fifth switch when the fifth switch is turned on, for sending signals received at the first end to the second end of the sixth switch, the sixth switch comprising transistors of the same type as the transistors of the first switch. The former stage full-swing shift register has an input end coupled with the second end of the third switch of the former stage multiplexer for temporarily storing signals sent by the third switch or the sixth switch when the third switch or the sixth switch is turned on. The latter stage multiplexer comprises a seventh switch having a first end for receiving a backward clock, the seventh switch being controlled by the forward control signal for sending the backward clock received at the first end to a second end of the seventh switch, the seventh switch comprising transistors of the same type as the transistors of the first switch; an eighth switch having a first end for receiving the disabling signal, a second end coupled with the second end of the seventh switch, the eighth switch being controlled by the backward control signal for sending the disabling signal received at the first end to the second end of the eighth switch, the eighth switch comprising transistors of the same type as the transistors of the first switch; a ninth switch having a first end coupled with an output end of the former stage full-swing shift register, the ninth switch being controlled by the backward clock sent by the seventh switch when the seventh switch is turned on and the disabling signal sent by the eighth switch when the eighth switch is turned on, for sending signals received at the first end to a second end of the ninth switch, the ninth switch comprising transistors of the same type as the transistors of the first switch; a tenth switch having a first end for receiving the backward clock, the tenth switch being controlled by the backward control signal for sending the backward clock received at the first end to a second end of the tenth switch, the tenth switch comprising transistors of the same type as the transistors of the first switch; an eleventh switch having a first end for receiving the disabling signal, a second end coupled with the second end of the tenth switch, the eleventh switch being controlled by the forward control signal for sending the disabling signal received at the first end to the second end of the eleventh switch, the eleventh switch comprising transistors of the same type as the transistors of the first switch; and a twelfth switch having a first end for receiving signals, a second end coupled with the second end of the ninth switch, the twelfth switch being controlled by the backward clock sent by the tenth switch when the tenth switch is turned on and the disabling signal sent by the eleventh switch when the eleventh switch is turned on, for sending signals received at the first end to the second end of the twelfth switch, the twelfth switch comprising transistors of the same type as the transistors of the first switch. The latter stage full-swing shift register has an input end coupled with the second end of the ninth switch of the latter stage multiplexer, an output end coupled with the first end of the sixth switch of the former stage multiplexer, the latter stage full-swing shift register being for temporarily storing signals sent by the ninth switch or the twelfth switch when the ninth switch or the twelfth switch is turned on.

The claimed invention further provides a bidirectional shift register having transistors of a same type. The bidirectional shift register comprises a former stage multiplexer for receiving a forward clock, a forward control signal, a backward control signal, a former stage forward input signal, and a former stage backward input signal; for selectively outputting the former stage forward input signal or the former stage backward input signal according to the forward clock, the forward control signal, and the backward control signal, a former stage full-swing shift register for receiving the forward clock, a backward clock, and the former stage forward input signal or the former stage backward input signal outputted by the former stage multiplexer; for outputting the received former stage forward input signal or the received former stage backward input signal according to the forward clock and the backward clock, a latter stage multiplexer for receiving the backward clock, the forward control signal, the backward control signal, a latter stage forward input signal, and a latter stage backward input signal; for selectively outputting the latter stage forward input signal or the latter stage backward input signal according to the backward clock, the forward control signal, and the backward control signal, and a latter stage full-swing shift register for receiving the forward clock, the backward clock, and the latter stage forward input signal or the latter stage backward input signal outputted by the latter stage multiplexer; and for outputting the received latter stage forward input signal or the received latter stage backward input signal according to the forward clock and the backward clock; wherein the former stage forward input signal or the former stage backward input signal outputted by the former stage full-swing shift register is taken as the latter stage forward input signal, and the latter stage forward input signal or the latter stage backward input signal outputted by the latter stage full-swing shift register is taken as the former stage backward input signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
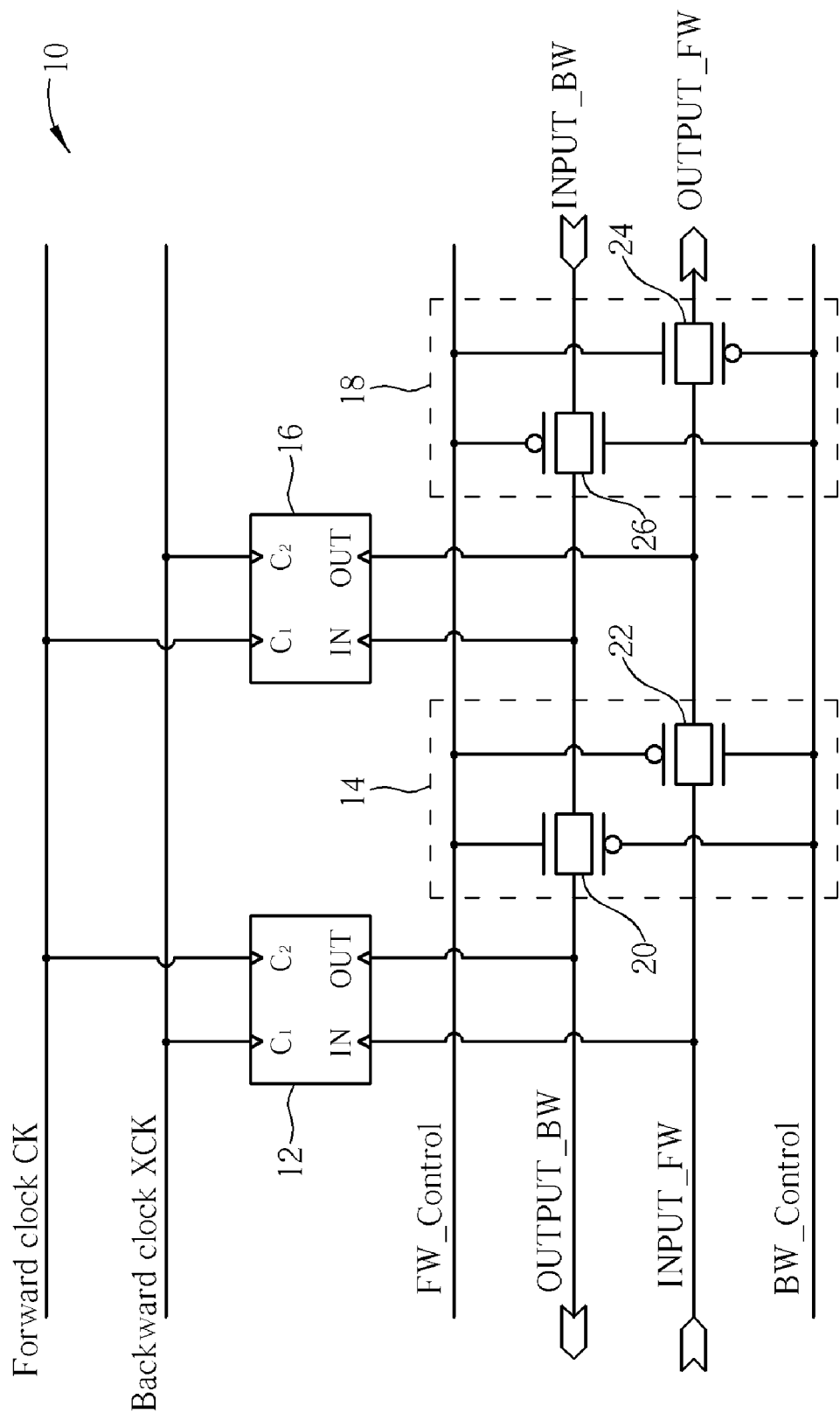
FIG. 1 is a circuit diagram of a CMOS bidirectional shift register made by applying LTPS technology on a glass substrate according to the prior art.
Figure 2:
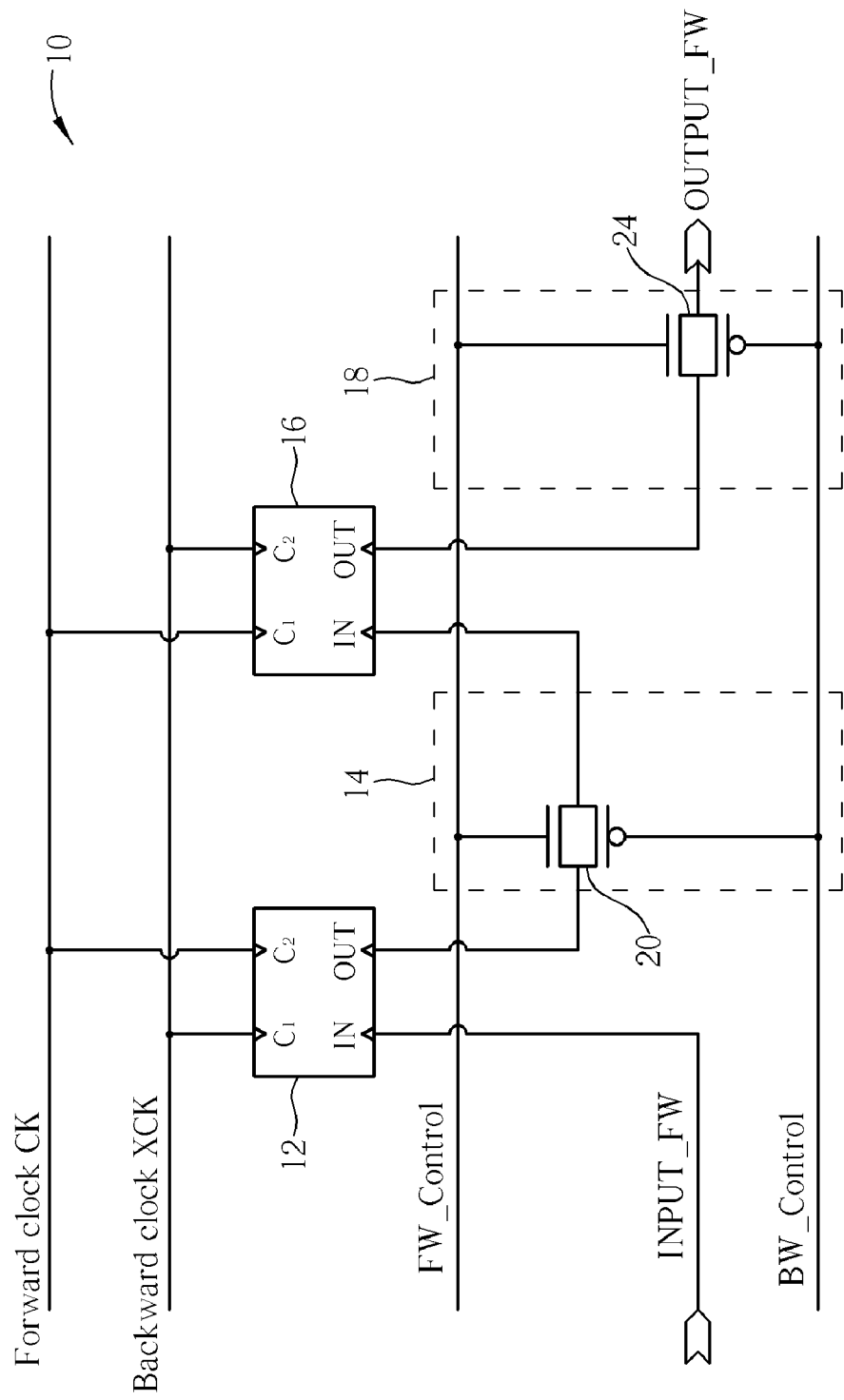
FIG. 2 is an equivalent circuit diagram of the bidirectional shift register in FIG. 1 when transmitting signals forward.
Figure 3:
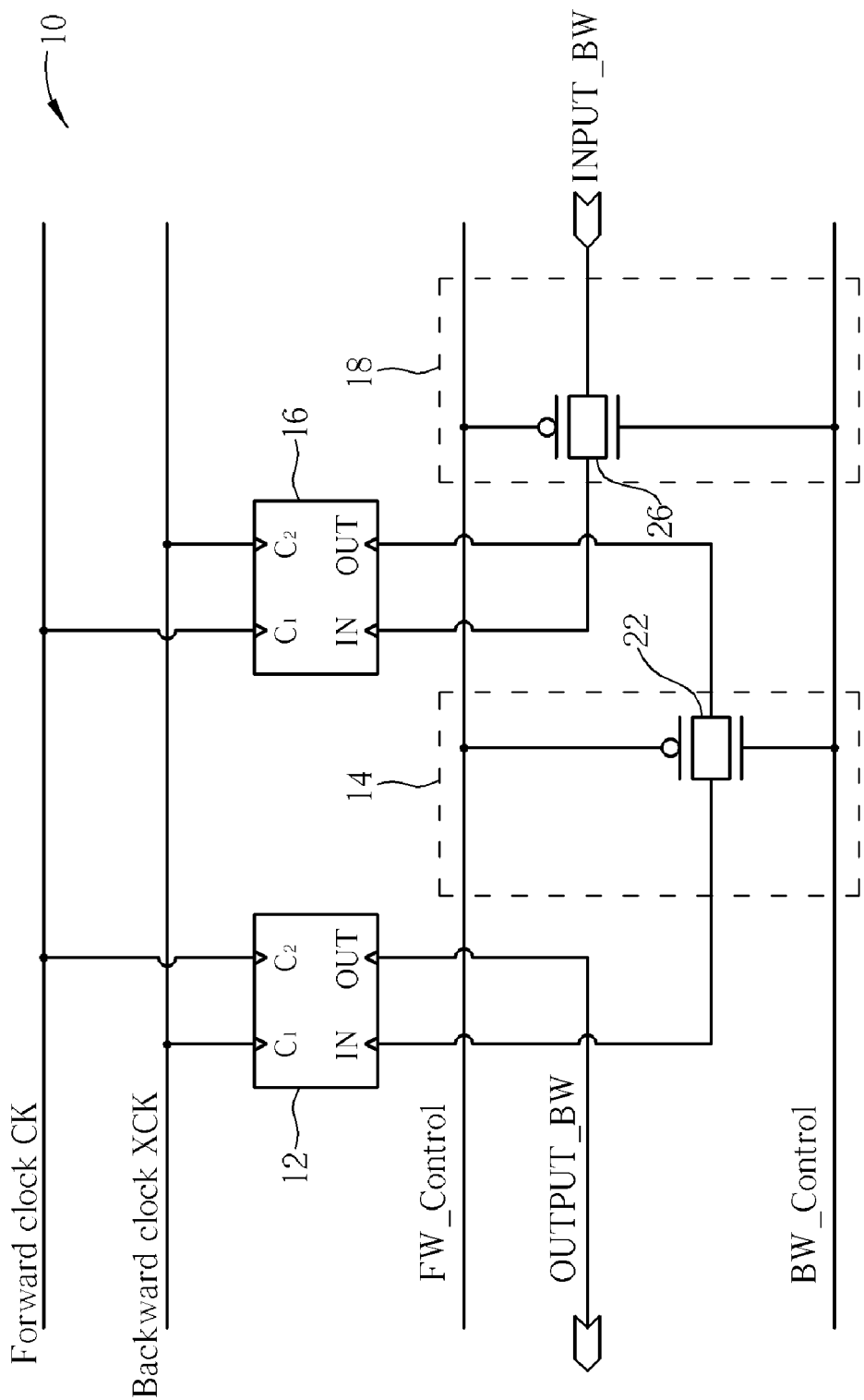
FIG. 3 is an equivalent circuit diagram of the bidirectional shift register in FIG. 1 when transmitting signals backward.
Figure 4:
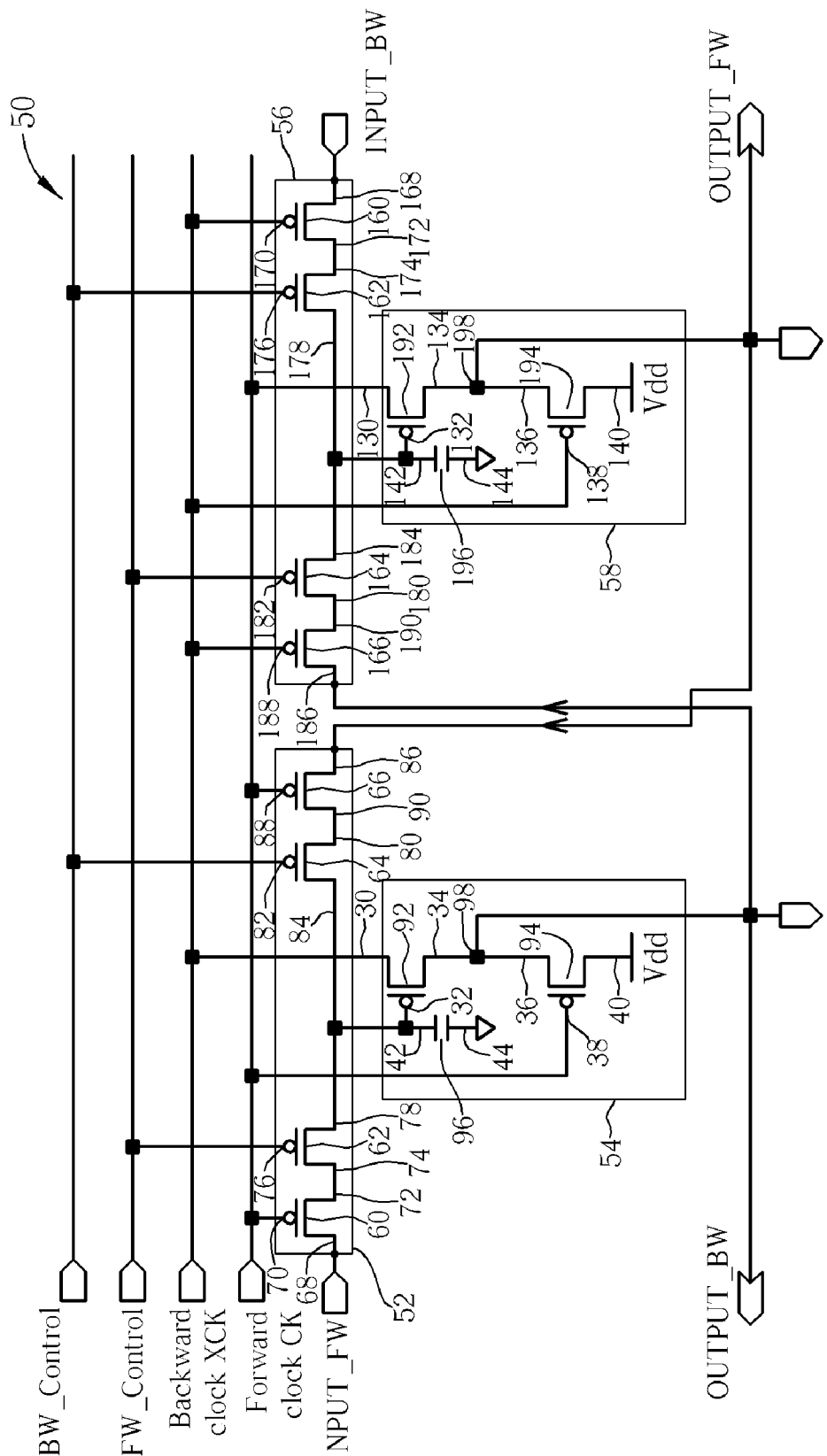
FIG. 4 is a circuit diagram of a first exemplary embodiment of a bidirectional shift register having transistors of a same type according to the present invention.

Please refer to FIG. 4, which is a circuit diagram of a first exemplary embodiment of a bidirectional shift register 50 having transistors of a same type according to the present invention. The bidirectional shift register 50 comprises a former stage multiplexer 52, a former stage full-swing shift register 54, a latter stage multiplexer 56, and a latter stage full-swing shift register 58.

In a first exemplary embodiment according to the present invention, the former stage multiplexer 52 comprises a first P-type MOS transistor 60, a second P-type MOS transistor 62, a third P-type MOS transistor 64, and a fourth P-type MOS transistor 66. A source 68 of the first P-type MOS transistor 60 is for receiving signals (similar to the forward input end INPUT_FW of the bidirectional shift register 10 in the prior art), and a gate 70 is for receiving a forward clock CK. A source 74 of the second P-type MOS transistor 62 is coupled with a drain 72 of the first P-type MOS transistor 60, and a gate 76 is for receiving a forward control signal FW_control. A drain of the third P-type MOS transistor 64 is coupled with a drain 78 of the second P-type MOS transistor 62, and a gate 82 is for receiving a backward control signal BW_control. A drain 90 of the fourth P-type MOS transistor 66 is coupled with a source 80 of the third P-type MOS transistor 64, and a gate 88 is for receiving the forward clock CK.

In a first exemplary embodiment according to the present invention, the former stage full-swing shift register 54 comprises a fifth P-type MOS transistor 92, a sixth P-type MOS transistor 94, and a former stage capacitor 96. A gate 32 of the fifth P-type MOS transistor 92 is coupled with the drain 78 of the second P-type MOS transistor 62, and a source 30 is for receiving a backward clock XCK. A source 36 of the sixth P-type MOS transistor 94 is coupled with a drain 34 of the fifth P-type MOS transistor 92, a gate 38 is coupled with the gate 70 of the first P-type MOS transistor 60, and a drain 40 is for coupling with a first power source Vdd. A first end 42 of the former stage capacitor 96 is coupled with the gate 32 of the fifth P-type MOS transistor 92, and a second end 44 is grounded.

In the first exemplary embodiment according to the present invention, the latter stage multiplexer 56 comprises a seventh P-type MOS transistor 160, an eighth P-type MOS transistor 162, a ninth P-type MOS transistor 164, and a tenth P-type MOS transistor 166. A source 168 of the seventh P-type MOS transistor 160 is for receiving signals (similar to the backward input end INPUT_BW of the bidirectional shift register 10 in the prior art), and a gate 170 is for receiving the backward clock XCK. A source 174 of the eighth P-type MOS transistor 162 is coupled with a drain 172 of the seventh P-type MOS transistor 160, and a gate 176 is for receiving the backward control signal BW_control. A drain 184 of the ninth P-type MOS transistor 164 is coupled with a drain 178 of the eighth P-type MOS transistor 162, and a gate 182 is for receiving the forward control signal FW_control. A drain 190 of the tenth P-type MOS transistor 166 is coupled with a source 180 of the ninth P-type MOS transistor 164, a gate 188 is for receiving the backward clock XCK, and a source 186 is coupled with the drain 34 of the fifth P-type MOS transistor 92 of the former stage full-swing shift register 54.

In the first exemplary embodiment according to the present invention, the latter stage full-swing shift register 58 comprises an eleventh P-type MOS transistor 192, a twelfth P-type MOS transistor 194, and a latter stage capacitor 196. A gate 132 of the eleventh P-type MOS transistor 192 is coupled with the drain 178 of the eighth P-type MOS transistor 162, a source 130 is for receiving the forward clock CK, and a drain 134 is coupled with a source 86 of the fourth P-type MOS transistor 66 of the former stage multiplexer 52. A source 136 of the twelfth P-type MOS transistor 194 is coupled with the drain 134 of the eleventh P-type MOS transistor 192, a gate 138 is coupled with the gate 170 of the seventh P-type MOS transistor 160, and a drain 140 is for coupling with the first power source Vdd. A first end 142 of the latter stage capacitor 196 is coupled with the gate 132 of the eleventh P-type MOS transistor 192, and a second end 144 is grounded.

Figure 5:
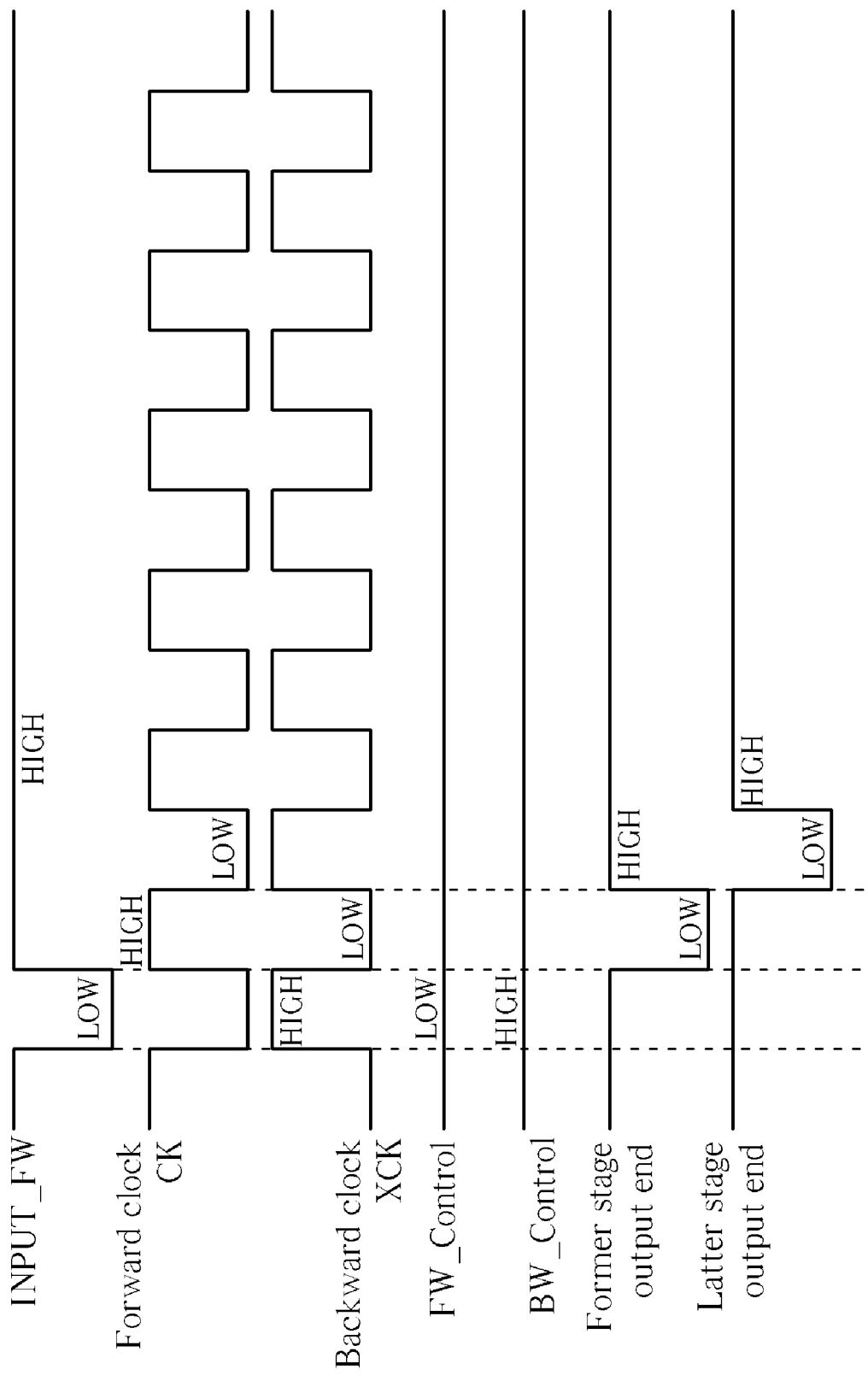
FIG. 5 is a wave diagram of the bidirectional shift register in FIG. 4 when transmitting signals forward.
Figure 6:
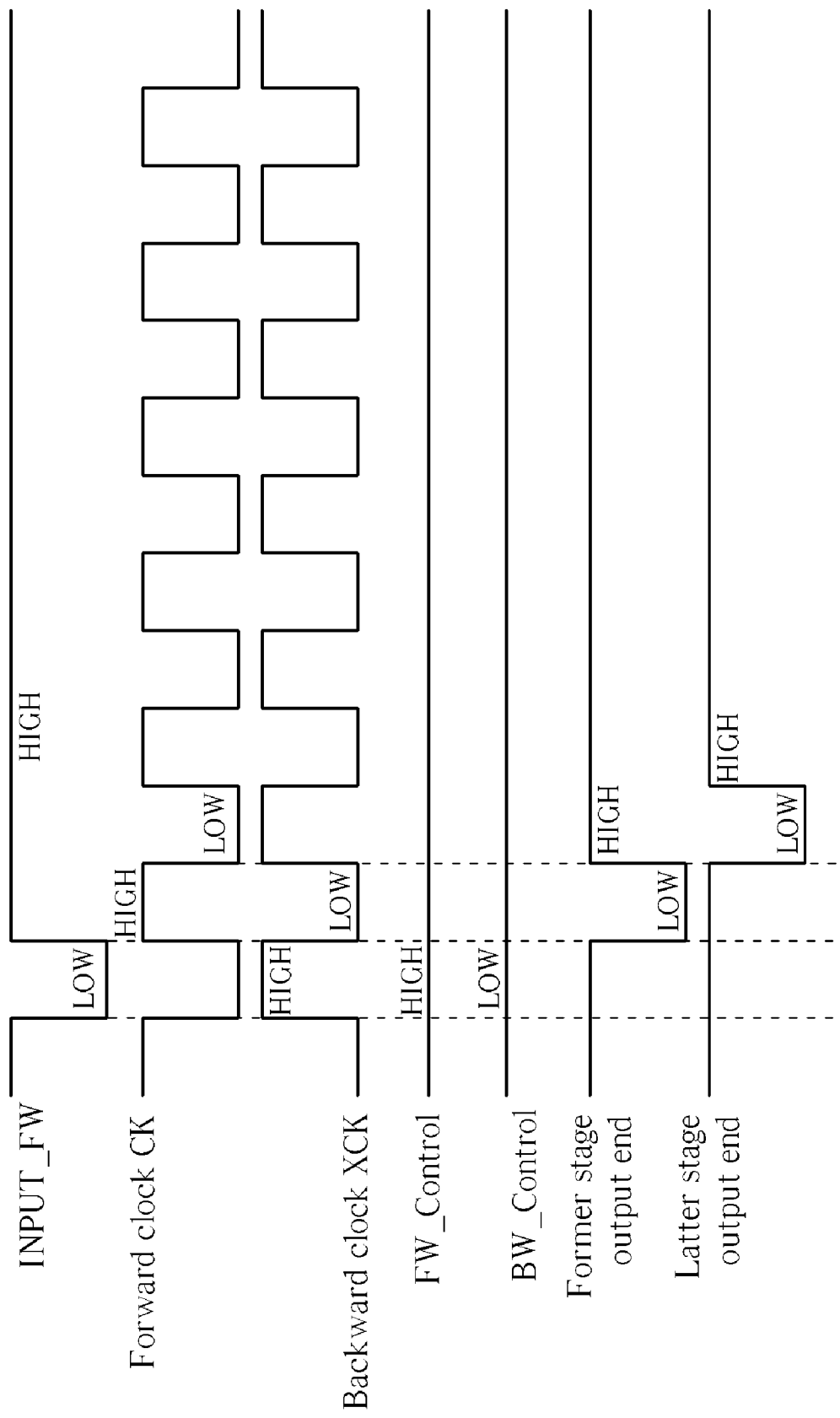
FIG. 6 is a wave diagram of the bidirectional shift register in FIG. 4 when transmitting signals forward.

The operation of the bidirectional shift register 50 is as follows. When the forward control signal FW_control has a logic low voltage and the backward control signal BW_control relative to the forward control signal FW_control has a logic high voltage, as FIG. 5 shows, both the third P-type MOS transistor 64 of the former stage multiplexer 52 and the eighth P-type MOS transistor 162 of the latter stage multiplexer 56 are electrically off, and both the second P-type MOS transistor 62 of the former stage multiplexer 52 and the ninth P-type MOS transistor 164 of the latter stage multiplexer 56 are on. Equivalently, the source 86 of the fourth P-type MOS transistor 66 of the former stage multiplexer 52 is not coupled with the drain 134 of the eleventh P-type MOS transistor 192 of the latter stage full-swing shift register 58. The signal inputted in the forward input end INPUT_FW, i.e., the source 68 of the first P-type MOS transistor 60 of the former stage multiplexer 52, of the bidirectional shift register 50 first goes to a former stage output end 98 of the former stage full-swing shift register 54 when the backward clock XCK has the logic low voltage and then goes to a latter stage output end 198 of the latter stage full-swing shift register 58 when the forward clock CK has the logic low voltage. The signal can be forwardly transmitted from the forward input end INPUT_FW to the forward output end OUTPUT_FW in a forward clock CK (or a backward clock XCK). On the other hand, when the forward control signal FW_control has the logic high voltage and the backward control signal BW_control relative to the forward control signal FW_control has the logic low voltage, as FIG. 6 shows, both the second P-type MOS transistor 62 of the former stage multiplexer 52 and the ninth P-type MOS transistor 164 of the latter stage multiplexer 56 are electrically off, and both the third P-type MOS transistor 64 of the former stage multiplexer 52 and the eighth P-type MOS transistor 162 of the latter stage multiplexer 56 are on. Equivalently, the source 186 of the tenth P-type MOS transistor 166 of the latter stage multiplexer 56 is not coupled with the drain 34 of the fifth P-type MOS transistor 92 of the former stage full-swing shift register 52. The signal inputted in the backward input end INPUT_BW, i.e., the source 168 of the seventh P-type MOS transistor 160 of the latter stage multiplexer 56, of the bidirectional shift register 50 first goes to the latter stage output end 198 of the latter stage full-swing shift register 58 when the backward clock XCK has the logic low voltage and then goes to the former stage output end 98 of the former stage full-swing shift register 54 when the forward clock CK has the logic low voltage. The signal can be backwardly transmitted from the backward input end INPUT_BW to the backward output end OUTPUT_BW in a forward clock CK (or a backward clock XCK).

In the first exemplary embodiment according to the present invention, all transistors included in the bidirectional shift register 50 are P-type MOS transistors. However, The bidirectional shift register according to the present invention can include N-type MOS transistors collocated with proper alternatives. Additionally, any P-type MOS transistor in the bidirectional shift register 50 can be treated as a switch, which is controlled by signals received by the gate of the P-type MOS transistor. For example, the first P-type MOS transistor 60 can be treated as a switch, and whether the switch is on or off is determined by the forward clock CK received by the gate 70 of the first P-type MOS transistor 60. Lastly, the former stage capacitor 96 disposed in the former stage full-swing shift register 54 (the same as the latter stage capacitor 196 in the latter stage full-swing shift register 58) allows the former stage output end 98 to output a full-swing signal.

Figure 7:
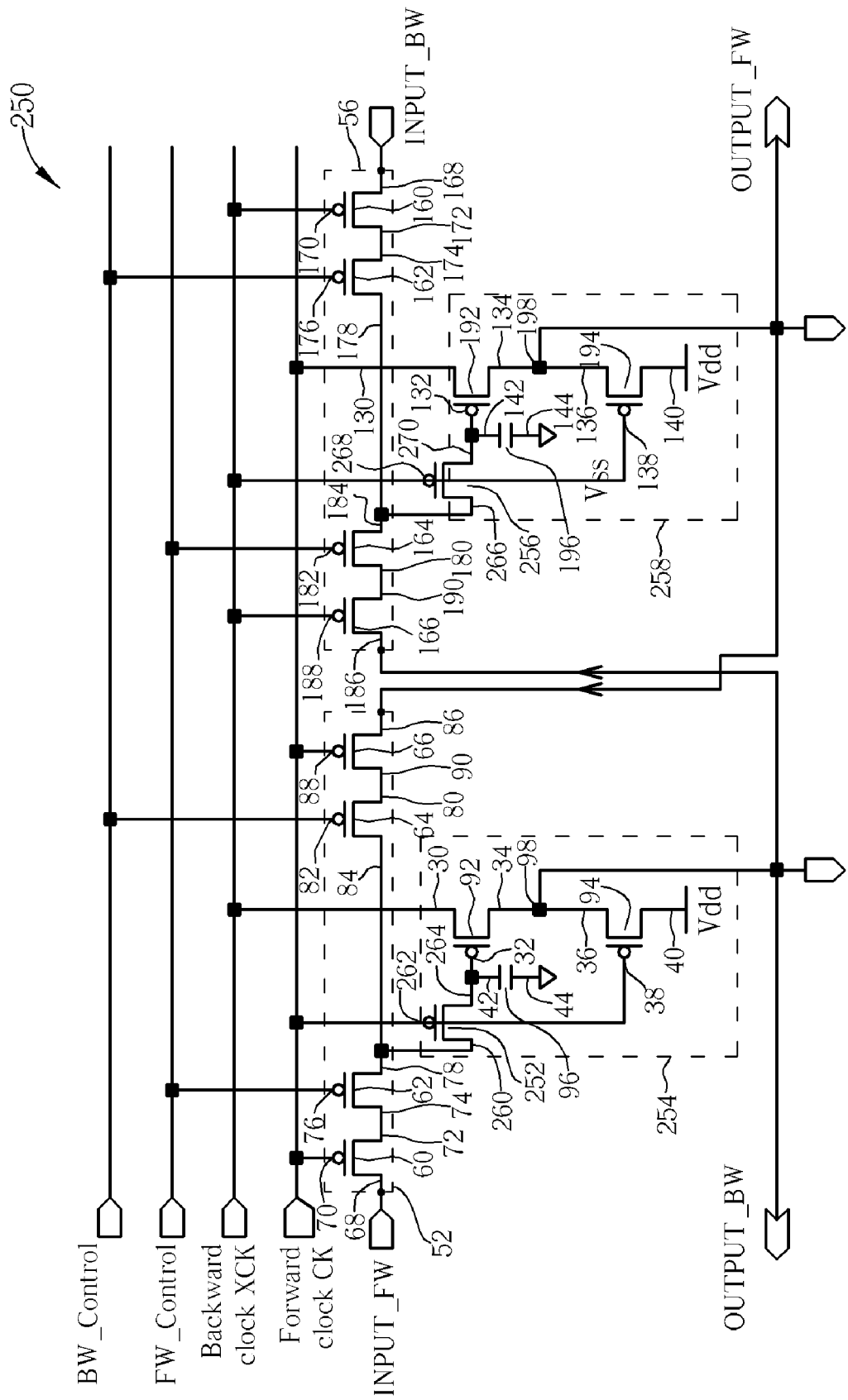
FIG. 7 is a circuit diagram of a second exemplary embodiment of a bidirectional shift register having transistors of a same type according to the present invention.

Please refer to FIG. 7, which is a circuit diagram of a second exemplary embodiment of a bidirectional shift register 250 having transistors of a same type according to the present invention. The bidirectional shift register 250 comprises a former stage multiplexer 52, a former stage full-swing shift register 254, a latter stage multiplexer 56, and a latter stage full-swing shift register 258.

In the second exemplary embodiment according to the present invention, besides the fifth P-type MOS transistor 92, the sixth P-type MOS transistor 94, and the former stage capacitor 96, the former stage full-swing shift register 254 further comprises a thirteenth P-type MOS transistor 252, which has a source 260 coupled with the drain 78 of the second P-type MOS transistor 62, a gate 262 coupled with a gate 38 of the sixth P-type MOS transistor 94, and a drain 264 coupled with the gate 32 of the fifth P-type MOS transistor 92. Due to the gate 262 of the thirteenth P-type MOS transistor 252 being coupled with the gate 70 of the first P-type MOS transistor 60 of the former multiplexer 52 (and the gate 70 of the first P-type MOS transistor 60 being coupled with the gate 38 of the sixth P-type MOS transistor 94), both the thirteenth P-type MOS transistor 252 and the first P-type MOS transistor 60 are either on or off at the same time. In other word, in the bidirectional shift register 250, signals inputted in the source 68 of the first P-type MOS transistor 60 of the former stage multiplexer 52 can go all the way to the drain 34 of the fifth P-type MOS transistor 92 when the forward clock CK has the logic low voltage (In the mean time, both the first P-type MOS transistor 60 and the thirteenth P-type MOS transistor 252 are on.), totally unaffected by the disposition of the thirteenth P-type MOS transistor 252.

Also in the second exemplary embodiment according to the present invention, besides the eleventh P-type MOS transistor 192, the twelfth P-type MOS transistor 194, and the latter stage capacitor 196, the latter stage full-swing shift register 258 further comprises a fifteenth P-type MOS transistor 256, which has a source 266 coupled with the drain 184 of the ninth P-type MOS transistor 164 of the latter stage multiplexer 56, a gate 268 for coupling with the gate 138 of the twelfth P-type MOS transistor 194, and a drain 270 coupled with the gate 132 of the eleventh P-type MOS transistor 192. Since the gate 268 of the fifteenth P-type MOS transistor 256 is coupled with the gate 170 of the seventh P-type MOS transistor 160 of the latter stage multiplexer 56 (and the gate 170 of the seventh P-type MOS transistor 160 is coupled with the gate 138 of the twelfth P-type MOS transistor 194), the fifteenth P-type MOS transistor 256 and the seventh P-type MOS transistor 160 are both on and off. In other word, in the bidirectional shift register 250, signals inputted in the source 168 of the seventh P-type MOS transistor 160 of the latter stage multiplexer 56 can go to the drain 134 of the eleventh P-type MOS transistor 192 when the backward clock XCK has the logic low voltage (in the meantime, both the seventh P-type MOS transistor 160 and the fifteenth P-type MOS transistor 256 are on) and not effected by the additional implementation of the fifteenth P-type MOS transistor 256.

Figure 8:
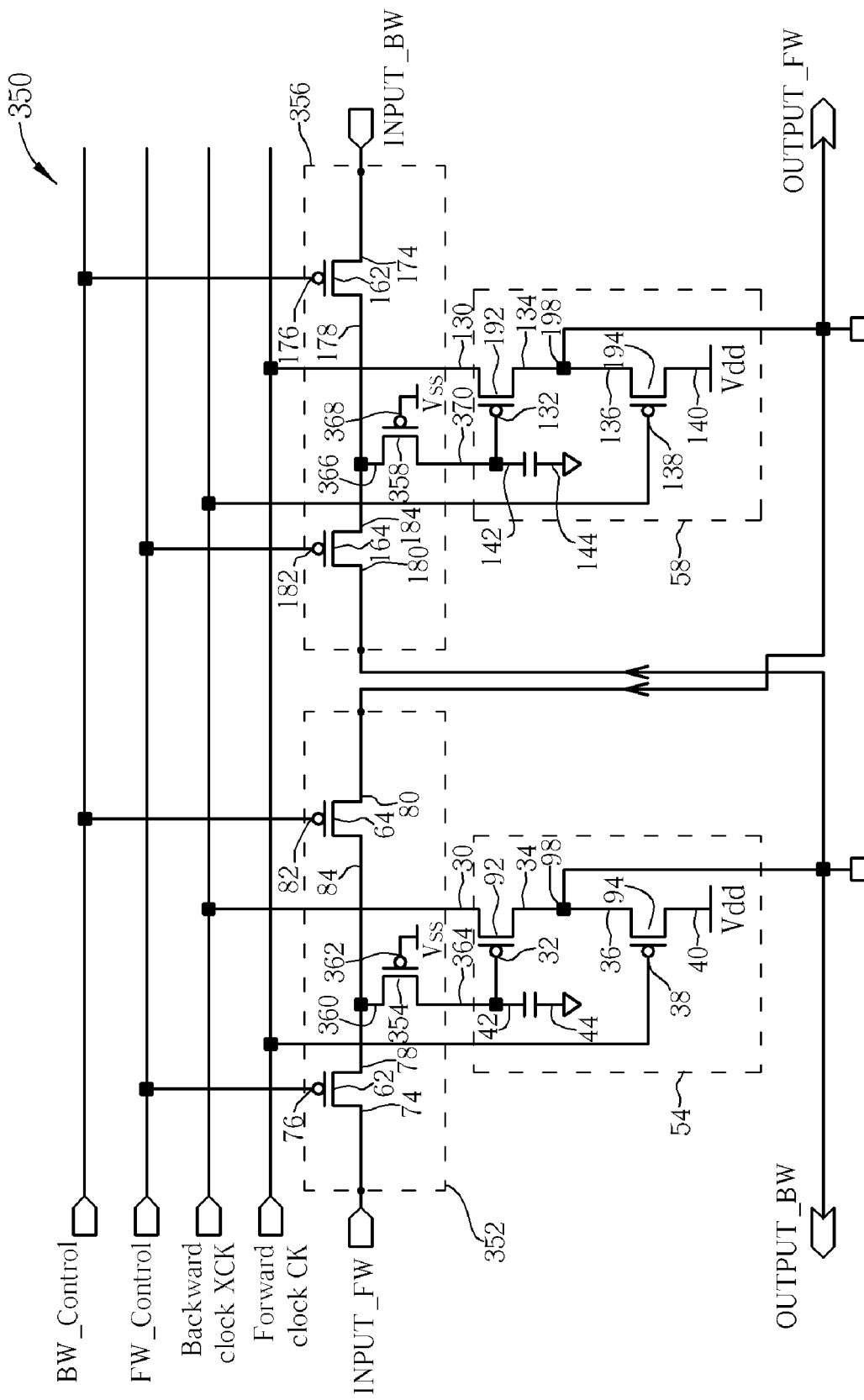
FIG. 8 is a circuit diagram of a third exemplary embodiment of a bidirectional shift register having transistors of a same type according to the present invention.

Please refer to FIG. 8, which is a circuit diagram of a third exemplary embodiment of a bidirectional shift register 350 having transistors of a same type according to the present invention. The bidirectional shift register 350 comprises a former stage multiplexer 352, a former stage full-swing shift register 54, a latter stage multiplexer 356, and a latter stage full-swing shift register 58.

In the third exemplary embodiment, the former stage multiplexer 352 comprises the second P-type MOS transistor 62 and the third P-type MOS transistor 64 of the former stage multiplexer 52 of the bidirectional shift register 50, and further comprises a fourteenth P-type MOS transistor 354 but excludes the first P-type MOS transistor 60 and the fourth P-type MOS transistor 66.

The source 74 of the second P-type MOS transistor 62 of the former stage multiplexer 352 is for receiving signals. The source 80 of the third P-type MOS transistor 64 is coupled with the latter stage output end 198 of the latter stage full-swing shift register 58. A source 360 of the fourteenth P-type MOS transistor 354 is coupled with the drain 78 of the second P-type MOS transistor 62, a gate 362 is coupled with a second power source Vss, and a drain 364 is coupled with the gate 32 of the fifth P-type MOS transistor 92. Since the gate 362 of the fourteenth P-type MOS transistor 354 is coupled with the second power source Vss, the fourteenth P-type MOS transistor 354 is always on.

In the third exemplary embodiment, the latter stage multiplexer 356 comprises the eighth P-type MOS transistor 162 and the ninth P-type MOS transistor 164 of the latter stage multiplexer 56 of the bidirectional shift register 50, and further comprises a sixteenth P-type MOS transistor 358 but excludes the seventh P-type MOS transistor 160 and the tenth P-type MOS transistor 166.

The source 174 of the eighth P-type MOS transistor 162 of the latter stage multiplexer 356 is for receiving signals. The source 180 of the ninth P-type MOS transistor 164 is coupled with the former stage output end 98 of the former stage full-swing shift register 54. A source 366 of the sixteenth P-type MOS transistor 358 is coupled with the drain 178 of the eighth P-type MOS transistor 162, a gate 368 is coupled with the second power source Vss, and a drain 370 is coupled with the gate 132 of the eleventh P-type MOS transistor 192. Since the gate 368 of the sixteenth P-type MOS transistor 358 is coupled with the second power source Vss, the sixteenth P-type MOS transistor 358 is always on.

The operation of the bidirectional shift register 350 in the third exemplary embodiment is similar with that of the bidirectional shift register 50 in the first exemplary embodiment.

As mentioned above, any P-type MOS transistor in the bidirectional shift register 50 (also in the bidirectional shift register 250 and 350) can be treated as a switch, which is controlled by signals received by the gate of the P-type MOS transistor.

For example, the first P-type MOS transistor 60 can be treated as a switch, and whether the switch is on or off is determined by received signals in the gate of the P-type MOS transistor. Please refer to FIG. 9, which is a circuit diagram of a fourth exemplary embodiment of a bidirectional shift register 450 having transistors of a same type according to the present invention. The bidirectional shift register 450 comprises a former stage multiplexer 452, a former stage full-swing shift register 54, a latter stage multiplexer 456, and a latter stage full-swing shift register 58.

In the fourth exemplary embodiment according to the present invention, the former stage multiplexer 452 comprises a first switch 454, a second switch 458, a third switch 460, a fourth switch 462, a fifth switch 464, and a sixth switch 466, wherein the on or off states of the first switch 454 and the fifth switch 464 are controlled by the forward control signal FW_control, the on or off states of the second switch 458 and the fourth switch 462 are controlled by the backward control signal BW_control, the on or off state of the third switch 460 is controlled by both the forward clock CK transmitted by the first switch 454 when the first switch 454 is on and a disabling signal Disable transmitted by the second switch 458 when the second switch is on, the on or off state of the sixth switch 466 is controlled by both the forward clock CK transmitted by the fourth switch 462 when the fourth switch is on and the disabling signal Disable transmitted by the fifth switch 464 when the fifth switch is on, and the third switch 460 and the sixth switch 466 are both off when controlled by the disabling signal Disable.

The operation of the former stage multiplexer 452 of the bidirectional shift register 450 is as follows. When the forward control signal FW_control is an enable signal (equivalent to the logic low voltage in the forward control signal FW_control of the bidirectional shift register 50) and the backward control signal BW_control relative to the forward control signal FW_control is a disable signal (equivalent to the logic high voltage in the backward control signal BW_control of the bidirectional shift register 50), the first switch 454 and the fifth switch are on, and the second switch 458 and the fourth switch 462 are off. In such way, the third switch 460 is on when the forward clock CK has the logic low voltage and therefore signals inputted in a forward input end 468 of the former stage multiplexer 452 go through the third switch 460 which is on and go to the former stage full-swing shift register 54, while the sixth switch 466 is off and signals, which are transmitted from the latter stage output end 198 of the latter stage full-swing shift register 58, inputted in a backward input end 470 of the former stage multiplexer 452 can not go to the former stage full-swing shift register 54. On the other hand, when the forward control signal FW_control is a disable signal and the backward control signal BW_control is an enable signal, both the first switch 454 and the fifth switch 464 are off and both the second switch 458 and the fourth switch 462 are on. In such way, signals inputted in the forward input end 468 of the former stage multiplexer 452 can not go to the former stage full-swing shift register 54 since the third switch 460 is always off, but signals inputted in the backward input end 470 of the former stage multiplexer 452 can go through the sixth switch 466, which is on, and go to the former stage full-swing shift register 54.

In the fourth exemplary embodiment according to the present invention, the structure and operation of the latter stage multiplexer 456 is similar with those of the former stage multiplexer 452. One thing that needs to be mentioned is that the first switch 454 and the fourth switch 462 of the former stage multiplexer 452 receive the forward clock CK, while the switches in the latter stage multiplexer 456 that lie in similar locations with the first switch 454 and the switch 462 of the former stage multiplexer 452 receive the backward clock XCK.

Figure 10:
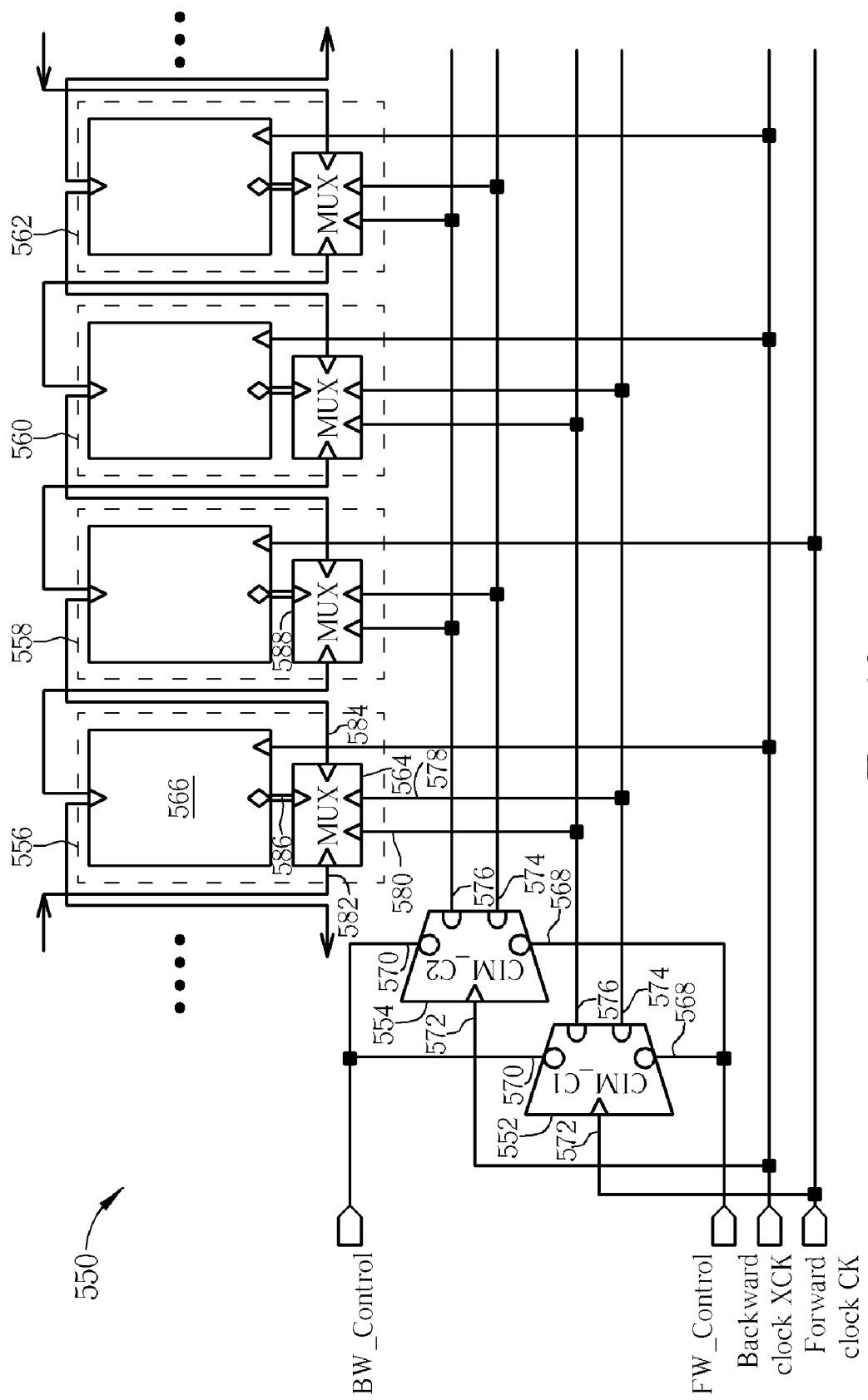
FIG. 10 is a circuit diagram of a fifth exemplary embodiment of a bidirectional shift register having transistors of a same type according to the present invention.

Please refer to FIG. 10, which is a circuit diagram of a fifth exemplary embodiment of a bidirectional shift register 550 having transistors of single type according to the present invention. The bidirectional shift register 550 comprises a forward multiplexer 552, a backward multiplexer 554, and a plurality of shift register sets 556, 558, 560, 562, which connect with each other in a series. Each shift register set comprises a multiplexer and a full-swing shift register. For example, the shift register set 556 comprises a multiplexer 564 and full-swing shift register 566.

In the fifth exemplary embodiment according to the present invention, both the forward multiplexer 552 and the backward multiplexer 554 comprise a forward signal end 568, a backward signal end 570, a clock end 572, a first output end 574, and a second output end 576. The forward multiplexer 552 (or the backward multiplexer 554) outputs the forward control signal FW_control and the backward control signal BW_control respectively in the first output end 574 and the second output end 576 according to the forward control signal FW_control inputted in the forward signal end 568, to the backward control signal BW_control inputted in the backward signal end 570, and to the clock inputted in the clock end 572 (The clock is a forward clock CK regarding the forward multiplexer 552 and a backward clock XCK regarding the backward multiplexer 554.). The multiplexer 564 comprises a first input end 578 coupled with the first output end 574 of the forward multiplexer 552, a second input end 580 coupled with the second output end 576, a forward input end 582, a backward input end 584, and an output end 586. The forward input end 582 is for receiving signals transmitted by a previous stage full-swing shift register relative to the full-swing shift register set 556 to which the multiplexer 564 belongs. The backward input end 584 is for receiving signals transmitted by the full-swing shift register 558, which is a following stage full-swing shift register set relative to the full-swing shift register set 556. The output end 586 is for selectively transmitting signals received by the forward input end 582 or the backward input end 584 to the full-swing shift register 558 or the previous stage full-swing shift register relative to the full-swing shift register 556 according to clock received in the first input end 578 and the second input end 580.

Figure 11:
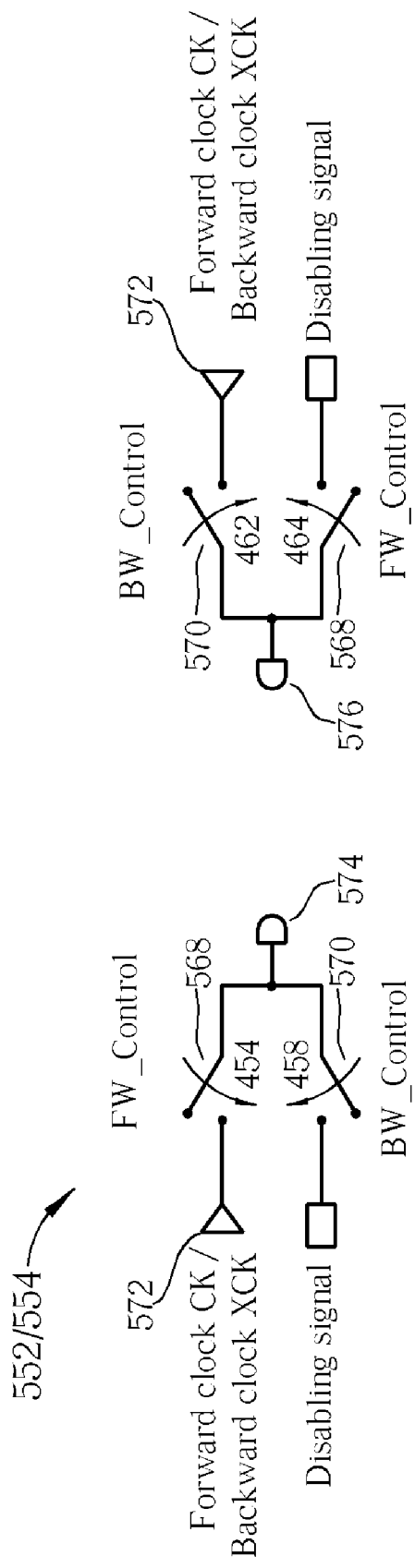
FIG. 11 is a circuit diagram of a forward multiplexer and a backward multiplexer of the bidirectional shift register in FIG. 10.

Please refer to FIG. 11, which is a circuit diagram of the forward multiplexer 552 (or the backward multiplexer 554). The forward multiplexer 552 comprises the first switch 454, the second switch 458, the fourth switch 462, and the fifth switch 464. Like the first switch 454 and the fifth switch 464 in the former stage multiplexer 452 of the bidirectional shift register 450, the on and off states of the first switch 454 and the fifth switch 454 of the forward multiplexer 552 are controlled by the forward control signal FW_control. Like the second switch 458 and the fourth switch 462 in the former stage multiplexer 452 of the bidirectional shift register 450, the on and off states of the second switch 458 and the fourth switch 462 of the forward multiplexer 552 are controlled by the backward control signal BW_control.

Figure 12:
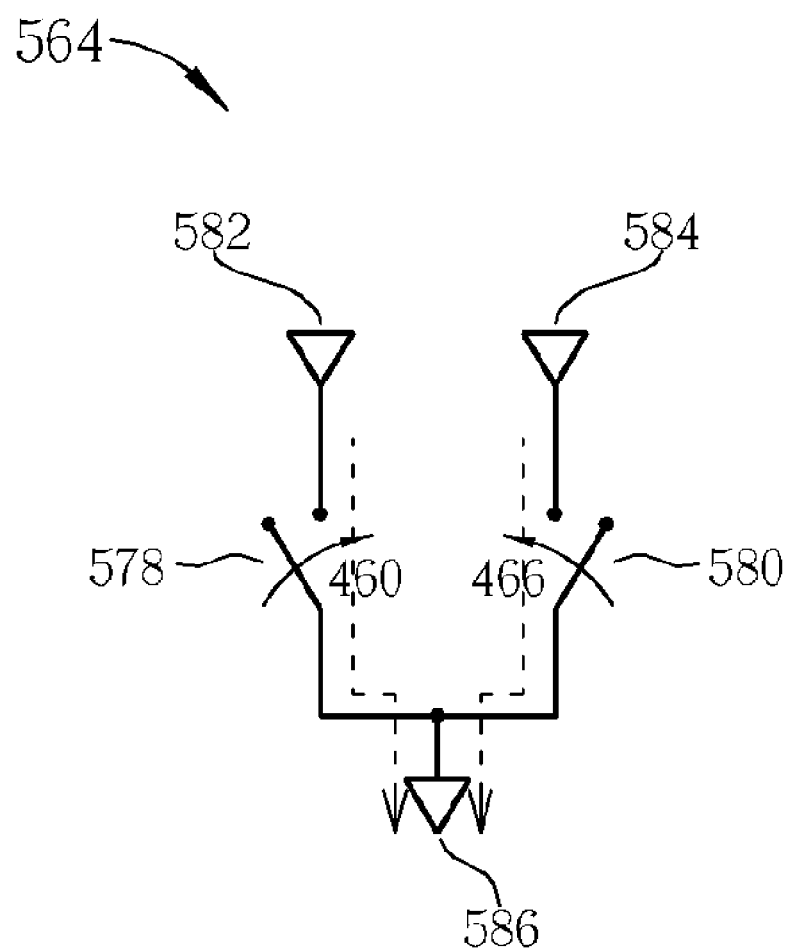
FIG. 12 is a circuit diagram of a multiplexer of a full-swing shift register of the bidirectional shift register in FIG. 10.

Please refer to FIG. 12, which is a circuit diagram of the multiplexer 564. The multiplexer 564 comprises the third switch 460 and the sixth switch 466. Like the third switch 460 and the sixth switch 466 in the former stage multiplexer 452 of the bidirectional shift register 450, the on and off states of the third switch 460 and the sixth switch 466 of the multiplexer 564 are respectively controlled by the forward clock CK transmitted by the first switch 454 and the fourth switch 462 when the first switch 454 or the fourth switch 462 is on.

Figure 9:
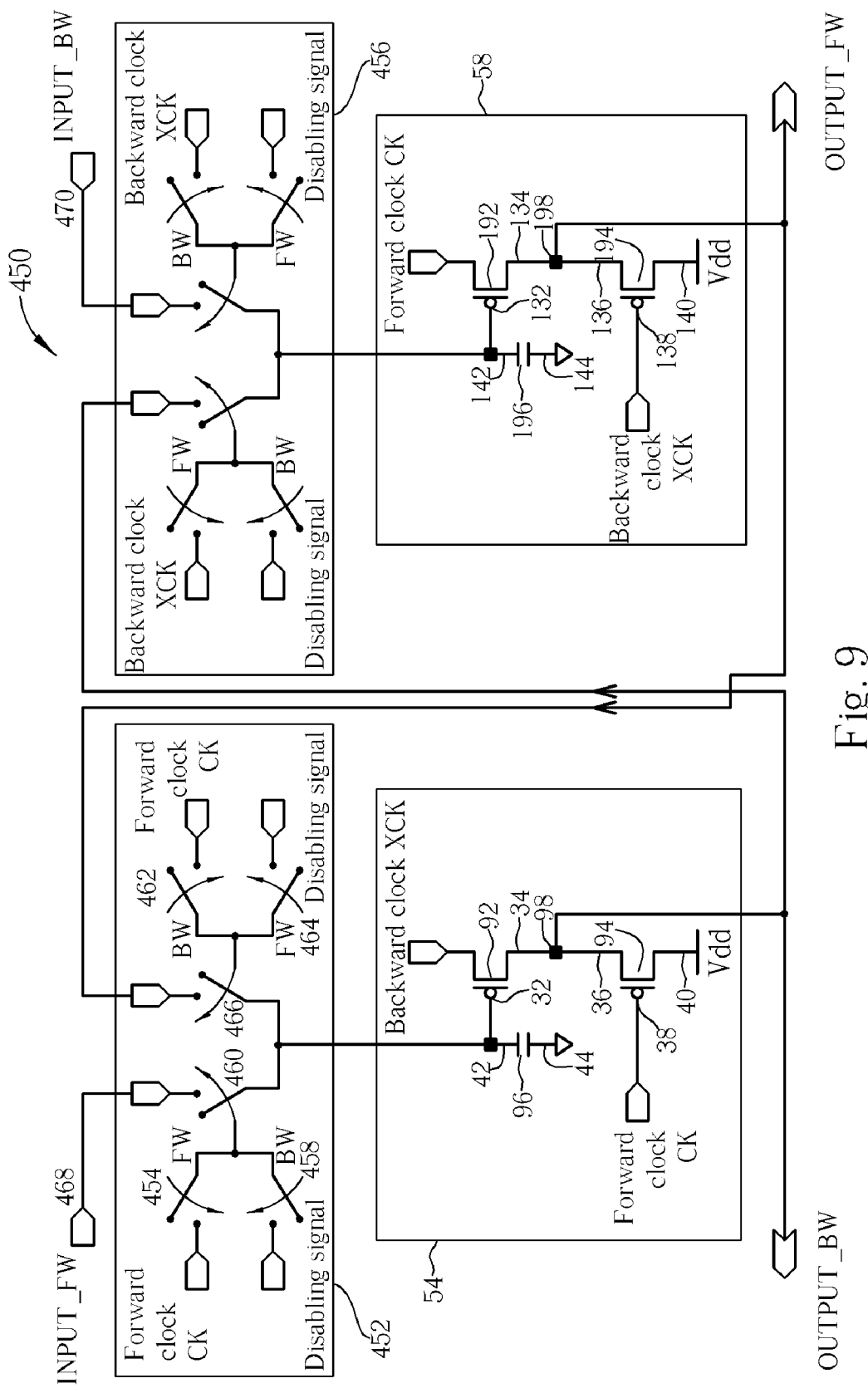
FIG. 9 is a circuit diagram of a fourth exemplary embodiment of a bidirectional shift register having transistors of a same type according to the present invention.

The structure of the bidirectional shift register 550 is the same as that of the bidirectional shift register 450 in FIG. 9. The forward multiplexer 552 of the bidirectional shift register 550 and the multiplexer 564 of the full-swing shift register 556 are equivalently the same as the former stage multiplexer 452 of the bidirectional shift register 450, and the backward multiplexer 554 and a multiplexer 588 of the full-swing shift register set 558 of the bidirectional shift register 550 are equivalently the same as the latter stage multiplexer 456 of the bidirectional shift register 450. The way of operation of the bidirectional shift register 550 is substantially the same as that of the bidirectional shift register 450.

Compared with the prior art, the bidirectional shift register according to the present invention comprises transistors of the same type, and in such way, only one set of light mask is needed when manufacturing the bidirectional shift register, which lowers the manufacturing cost. Additionally, the present invention can be used to easily implement present scan driver shift registers and source driver shift registers on glass substrates, where such class of shift registers has the ability of switching direction, which means it can scan in both forward and backward ways. Finally, the present invention can be applied on any kinds of progressive matrix flat panels such as AMLCD and AMOLED.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bidirectional shift register comprising:
   a former stage multiplexer comprising:
      a first transistor having a source for receiving a signal and a gate for receiving a forward clock;
      a second transistor having a source coupled with a drain of the first transistor, a gate for receiving a forward control signal, the second transistor being of a same type as the first transistor;
      a third transistor having a drain coupled with a drain of the second transistor, a gate for receiving a backward control signal, the third transistor being of the same type as the first transistor; and
      a fourth transistor having a drain coupled with a source of the third transistor, a gate for receiving the forward clock, the fourth transistor being of the same type as the first transistor;
   a former stage full-swing shift register comprising:
      a fifth transistor having a gate coupled with the drain of the second transistor, a source for receiving a backward clock, the fifth transistor being of the same type as the first transistor;
      a sixth transistor having a source coupled with a drain of the fifth transistor, a gate coupled with the gate of the first transistor, a drain for coupling with a first power source, the sixth transistor being of the same type as the first transistor; and
      a former stage capacitor having a first end coupled with the gate of the fifth transistor and a second end grounded;
   a latter stage multiplexer comprising:
      a seventh transistor having a source for receiving a signal and a gate for receiving the backward clock, the seventh transistor being of the same type as the first transistor;
      an eighth transistor having a source coupled with a drain of the seventh transistor, a gate for receiving the backward control signal, the eighth transistor being of the same type as the first transistor;
      a ninth transistor having a drain coupled with a drain of the eighth transistor, a gate for receiving the forward control signal, the ninth transistor being of the same type as the first transistor; and
      a tenth transistor having a drain coupled with a source of the ninth transistor, a gate for receiving the backward clock, a source coupled with the drain of the fifth transistor of the former stage full-swing shift register, the tenth transistor being of the same type as the first transistor; and
   a latter stage full-swing shift register comprising:
      an eleventh transistor having a gate coupled with the drain of the eighth transistor, a source for receiving the forward clock, a drain coupled with the source of the fourth transistor of the former stage multiplexer, the eleventh transistor being of the same type as the first transistor;
a twelfth transistor having a source coupled with the drain of the eleventh transistor, a gate coupled with the gate of the seventh transistor, a drain for coupling with the first power source, the twelfth transistor being of the same type as the first transistor; and
a latter stage capacitor having a first end coupled with the gate of the eleventh transistor and a second end grounded.

2. The bidirectional shift register of claim 1 wherein the former stage full-swing shift register further comprises:
a thirteenth transistor having a source coupled with the drain of the second transistor, a gate coupled with the gate of the sixth transistor, a drain coupled with the gate of the fifth transistor, the thirteenth transistor being of the same type as the first transistor.

3. The bidirectional shift register of claim 1 wherein the latter stage full-swing shift register further comprises:
a fifteenth transistor having a source coupled with the drain of the eighth transistor, a gate coupled with the gate of the twelfth transistor, a drain coupled with the gate of the eleventh transistor, the fifteenth transistor being of the same type as the first transistor.

4. The bidirectional shift register of claim 1 wherein the former stage multiplexer further comprises:
a fourteenth transistor having a source coupled with the drain of the second transistor, a gate for coupling with a second power source, a drain coupled with the gate of the fifth transistor, the fourteenth transistor being of the same type as the first transistor.

5. The bidirectional shift register of claim 1 wherein the latter stage multiplexer further comprises:
a sixteenth transistor having a source coupled with the drain of the eighth transistor, a gate for coupling with a second power source, a drain coupled with the gate of the eleventh transistor, the sixteenth transistor being of the same type as the first transistor.

6. A bidirectional shift register having transistors of a same type comprising:
a former stage multiplexer comprising:
a first switch having a first end for receiving a forward clock, the first switch being controlled by a forward control signal for sending the forward clock received at the first end to a second end of the first switch;
a second switch having a first end for receiving a disabling signal, a second end coupled with the second end of the first switch, the second switch being controlled by a backward control signal for sending the disabling signal received at the first end to the second end of the second switch, the second switch comprising transistors of a same type as the transistors of the first switch;
a third switch having a first end for receiving signals, the third switch being controlled by the forward clock sent by the first switch when the first switch is turned on and the disabling signal sent by the second switch when the second switch is turned on, for sending signals received at the first end to a second end of the third switch, the third switch comprising transistors of the same type as the transistors of the first switch;
a fourth switch having a first end for receiving the forward clock, the fourth switch being controlled by the backward control signal for sending the forward clock received at the first end to a second end of the fourth switch, the fourth switch comprising transistors of the same type as the transistors of the first switch;
a fifth switch having a first end for receiving the disabling signal, a second end coupled with the second end of the fourth switch, the fifth switch being controlled by the forward control signal for sending the disabling signal received at the first end to the second end of the fifth switch, the fifth switch comprising transistors of the same type as the transistors of the first switch; and
a sixth switch having a first end for receiving signals, a second end coupled with the second end of the third switch, the sixth switch being controlled by the forward clock sent by the fourth switch when the fourth switch is turned on and the disabling signal sent by the fifth switch when the fifth switch is turned on, for sending signals received at the first end to the second end of the sixth switch, the sixth switch comprising transistors of the same type as the transistors of the first switch;
a former stage full-swing shift register having an input end coupled with the second end of the third switch of the former stage multiplexer for temporarily storing signals sent by the third switch or the sixth switch when the third switch or the sixth switch is turned on;
a latter stage multiplexer comprising:
a seventh switch having a first end for receiving a backward clock, the seventh switch being controlled by the forward control signal for sending the backward clock received at the first end to a second end of the seventh switch, the seventh switch comprising transistors of the same type as the transistors of the first switch;
an eighth switch having a first end for receiving the disabling signal, a second end coupled with the second end of the seventh switch, the eighth switch being controlled by the backward control signal for sending the disabling signal received at the first end to the second end of the eighth switch, the eighth switch comprising transistors of the same type as the transistors of the first switch;
a ninth switch having a first end coupled with an output end of the former stage full-swing shift register, the ninth switch being controlled by the backward clock sent by the seventh switch when the seventh switch is turned on and the disabling signal sent by the eighth switch when the eighth switch is turned on, for sending signals received at the first end to a second end of the ninth switch, the ninth switch comprising transistors of the same type as the transistors of the first switch;
a tenth switch having a first end for receiving the backward clock, the tenth switch being controlled by the backward control signal for sending the backward clock received at the first end to a second end of the tenth switch, the tenth switch comprising transistors of the same type as the transistors of the first switch;
an eleventh switch having a first end for receiving the disabling signal, a second end coupled with the second end of the tenth switch, the eleventh switch being controlled by the forward control signal for sending the disabling signal received at the first end to the second end of the eleventh switch, the eleventh switch comprising transistors of the same type as the transistors of the first switch; and a twelfth switch having a first end for receiving signals, a second end coupled with the second end of the ninth switch, the twelfth switch being controlled by the backward clock sent by the tenth switch when the tenth switch is turned on and the disabling signal sent by the eleventh switch when the eleventh switch is turned on, for sending signals received at the first end to the second end of the twelfth switch, the twelfth switch comprising transistors of the same type as the transistors of the first switch; and a latter stage full-swing shift register having an input end coupled with the second end of the ninth switch of the latter stage multiplexer, an output end coupled with the first end of the sixth switch of the former stage multiplexer, the latter stage full-swing shift register being for temporarily storing signals sent by the ninth switch or the twelfth switch when the ninth switch or the twelfth switch is turned on.

7. A bidirectional shift register having transistors of a same type comprising:

a former stage multiplexer for receiving a forward clock, a forward control signal, a backward control signal, a former stage forward input signal, and a former stage backward input signal, and for selectively outputting the former stage forward input signal or the former stage backward input signal according to the forward clock, the forward control signal, and the backward control signal;

a former stage full-swing shift register for receiving the forward clock, a backward clock, and the former stage forward input signal or the former stage backward input signal outputted by the former stage multiplexer, and for outputting the received former stage forward input signal or the received former stage backward input signal according to the forward clock and the backward clock;

a latter stage multiplexer for receiving the backward clock, the forward control signal, the backward control signal, a latter stage forward input signal, and a latter stage backward input signal, and for selectively outputting the latter stage forward input signal or the latter stage backward input signal according to the backward clock, the forward control signal, and the backward control signal; and a latter stage full-swing shift register for receiving the forward clock, the backward clock, and the latter stage forward input signal or the latter stage backward input signal outputted by the latter stage multiplexer, and for outputting the received latter stage forward input signal or the received latter stage backward input signal according to the forward clock and the backward clock;

wherein the former stage forward input signal or the former stage backward input signal outputted by the former stage full-swing shift register is taken as the latter stage forward input signal, and the latter stage forward input signal or the latter stage backward input signal outputted by the latter stage full-swing shift register is taken as the former stage backward input signal.

8. The bidirectional shift register of claim 7 wherein the former stage multiplexer comprises:

a first transistor having a source for receiving the former stage forward input signal and a gate for receiving the forward clock;

a second transistor having a source coupled with a drain of the first transistor, a gate for receiving the forward control signal, the second transistor being of a same type as the first transistor;

a third transistor having a drain coupled with a drain of the second transistor, a gate for receiving the backward control signal, the third transistor being of the same type as the first transistor; and a fourth transistor having a drain coupled with a source of the third transistor, a gate for receiving the forward clock, a source for receiving the former stage backward input signal, the fourth transistor being of the same type as the first transistor.

9. The bidirectional shift register of claim 7 wherein the former stage full-swing shift register comprises:

a fifth transistor having a gate for receiving the former stage forward input signal or the former stage backward input signal outputted by the former stage multiplexer, a source for receiving the backward clock, a drain for outputting the former stage forward input signal or the former stage backward input signal being taken as the latter stage forward input signal, the fifth transistor being of a same type as the first transistor;

a sixth transistor having a source coupled with the drain of the fifth transistor, a gate for receiving the forward clock, a drain for coupling with a first power source, the sixth transistor being of a same type as the fifth transistor; and a former stage capacitor having a first end coupled with the gate of the fifth transistor and a second end grounded.

10. The bidirectional shift register of claim 7 wherein the latter stage multiplexer comprises:

a seventh transistor having a source for receiving the latter stage forward input signal and a gate for receiving the backward clock, the seventh transistor being of a same type as the first transistor;

an eighth transistor having a source coupled with a drain of the seventh transistor, a gate for receiving the backward control signal, the eighth transistor being of a same type as the seventh transistor;

a ninth transistor having a drain coupled with a drain of the eighth transistor, a gate for receiving the forward control signal, the ninth transistor being of the same type as the seventh transistor; and a tenth transistor having a drain coupled with a source of the ninth transistor, a gate for receiving the backward clock, a source for receiving the former stage forward input signal or the former stage backward input signal outputted by the former stage full-swing shift register, the tenth transistor being of the same type as the seventh transistor.

11. The bidirectional shift register of claim 7 wherein the latter stage full-swing shift register comprises:

an eleventh transistor having a gate for receiving the latter stage forward input signal or the latter stage backward input signal outputted by the latter stage multiplexer, a source for receiving the forward clock, a drain for outputting the latter stage forward input signal or the latter stage backward input signal being taken as the former stage backward input signal, the eleventh transistor being of a same type as the first transistor;

a twelfth transistor having a source coupled with the drain of the eleventh transistor, a gate for receiving the backward clock, a drain for coupling with a first power source, the twelfth transistor being of a same type as the eleventh transistor; and a latter stage capacitor having a first end coupled with the gate of the eleventh transistor and a second end grounded.

12. The bidirectional shift register of claim 7 wherein the former stage full-swing shift register further comprises:

a thirteenth transistor having a source for receiving the former stage forward input signal or the former stage backward input signal outputted by the former stage multiplexer, a gate coupled with the gate of the sixth transistor, a drain coupled with the gate of the fifth transistor, the thirteenth transistor being of the same type as the fifth transistor.

13. The bidirectional shift register of claim 7 wherein the latter stage full-swing shift register further comprises:

a fifteenth transistor having a source for receiving the latter stage forward input signal or the latter stage backward input signal outputted by the latter stage multiplexer, a gate coupled with the gate of the twelfth transistor, a drain coupled with the gate of the eleventh transistor, the fifteenth transistor being of the same type as the eleventh transistor.

14. The bidirectional shift register of claim 7 wherein the former stage multiplexer further comprises:

a fourteenth transistor having a source for receiving the former stage forward input signal or the former stage backward input signal outputted by the former stage multiplexer, a gate for coupling with a second power source, a drain coupled with the gate of the fifth transistor, the fourteenth transistor being of the same type as the fifth transistor.

15. The bidirectional shift register of claim 7 wherein the latter stage multiplexer further comprises:

a sixteenth transistor having a source for receiving the latter stage forward input signal or the latter stage backward input signal outputted by the latter stage multiplexer, a gate for coupling with a second power source, a drain coupled with the gate of the eleventh transistor, the sixteenth transistor being of the same type as the eleventh transistor.

* * * * *